United States Patent [19]

Sudo et al.

[11] Patent Number: 4,480,248
[45] Date of Patent: Oct. 30, 1984

[54] TEMPERATURE AND AGING COMPENSATED MAGNETORESISTIVE DIFFERENTIAL POTENTIOMETER

[75] Inventors: Michio Sudo, Kuki; Hitoshi Miura, Tatebayashi, both of Japan

[73] Assignee: Kangyo Denkikiki Kabushiki Kaisha, Tokyo, Japan

[21] Appl. No.: 477,572

[22] Filed: Mar. 21, 1983

[30] Foreign Application Priority Data

Mar. 29, 1982 [JP] Japan .................................. 57-50645

[51] Int. Cl.³ ...................... G01R 33/02; H01L 43/08
[52] U.S. Cl. .................................. 338/32 R; 324/252; 324/208; 324/207
[58] Field of Search ............... 338/32 R, 32 H; 323/294, 368; 324/252, 208, 207; 73/497, 779; 340/870.38, 870.33

[56] References Cited

U.S. PATENT DOCUMENTS 3,691,502  9/1972  Kataoka ........................ 338/32 R

FOREIGN PATENT DOCUMENTS 47-39631  5/1972  Japan ............................ 323/368
57-48285  3/1982  Japan .......................... 338/32 R

OTHER PUBLICATIONS

Bajovek et al., "Magnetoresistive Circuit Sensor", IBM Technical Disclosure Bulletin, vol. 18, #8, Jan. 1976, pp. 2745-2748.

Primary Examiner—C. L. Albritton
Assistant Examiner—C. N. Sears
Attorney, Agent, or Firm—Pollock, Vande Sande and Priddy

[57] ABSTRACT

A magnetoresistive element comprises first to fourth magnetoresistive parts formed on a substrate. The first and second magnetoresistive parts are connected in series, and the third and fourth magnetoresistive parts are also connected in series. These series connected parts are connected in parallel to one another, first and second terminals are provided at from both ends of the parallel connection and, third and fourth terminals are provided at the junction of the first and second magnetoresistive parts and at the junction of the third and fourth magnetoresistive parts, respectively. The resistive values of the first and second magnetoresistive parts in the absence of a magnetic field are substantially equal, and the resistance values of the third and fourth magnetoresistive parts in the absence of a magnetic field are also substantially equal. The arrangement is such that when a magnet is moved relative to the magnetoresistive element, the resistance values of the first and second magnetoresistive parts operatively change and the third magnetoresistive part is always exposed to a magnetic field from the magnet, but the fourth magnetoresistive part is not exposed to the magnetic field at all times.

10 Claims, 17 Drawing Figures

TEMPERATURE AND AGING COMPENSATED MAGNETORESISTIVE DIFFERENTIAL POTENTIOMETER

BACKGROUND OF THE INVENTION

The present invention relates to a magnetoresistive element for use in a displacement sensor, a contactless potentiometer and so forth and, more particularly, to a magnetoresistive element which is free from the influence of temperature variations and aging.

Magnetosensitive materials heretofore employed for magnetoresistive elements are defective in that their resistance-magnetic field characteristic is relatively seriously affected by temperature variations. In a magnetoresistive element proposed as a solution to this problem, a pair of magnetosensitive material parts having the same characteristics are aligned in their lengthwise direction and connected in series to each other; a voltage is applied across the series connection of the magnetoresistive parts; an output terminal is led out from their connection point; and a magnet is disposed in opposing relation to the magnetoresistive parts and moved in their lengthwise direction so that an area of one of the parts covered by the magnet may increase while at the same time an area of the other part covered by the magnet may decrease. In such an arrangement, however, in order to completely prevent the influence of temperature variations and aging, it is necessary so that the resistance-temperature coefficient and the aging coefficient of the magnetoresistive parts remain unchanged regardless of whether a magnetic field is applied to them or not. In general, however, these coefficients do not remain constant. For this reason, the conventional magnetoresistive elements have the drawback that they are subject to the influence of temperature variations and aging.

SUMMARY OF THE INVENTION

It is therefore an object of the present invention to provide a magnetoresistive element which is almost free from the influence of temperature variations and aging, and hence can be employed in a high precision non-contact displacement sensor, potentiometer or the like.

According to the present invention, four magnetoresistive parts are formed on the same substrate and connected in series in pairs and their connection points are connected to different terminals. The series-connected magnetoresistive parts are connected in parallel to one another and the both connection points are connected to individual terminals. The resistance values of the two magnetoresistive parts of the one series connection in the absence of the magnetic field are made nearly equal to each other and, similarly, the resistance values of the two magnetoresistive parts of the other series connection in the absence of the magnetic field are made nearly equal to each other. The four magnetoresistive parts are arranged so that when a magnetic field (a magnet) is moved relative to one of the two series connections in the direction of their arrangement, one of the other series-connected magnetoresistive parts or a portion thereof is always exposed to the magnetic field but the other portion is not exposed thereto at all times. With such an arrangement, by properly taking out and processing the output from the four terminals, it is possible to perform:

(1) automatic compensation for temperature variations of the sensitivity of the magnetoresistive element;
(2) automatic compensation for aging of the magnetoresistive element;
(3) automatic compensation for temperature variations of the magnet used; and
(4) automatic compensation for aging of the magnet used.

DESCRIPTION OF THE PREFERRED EMBODIMENTS

Figure 1:
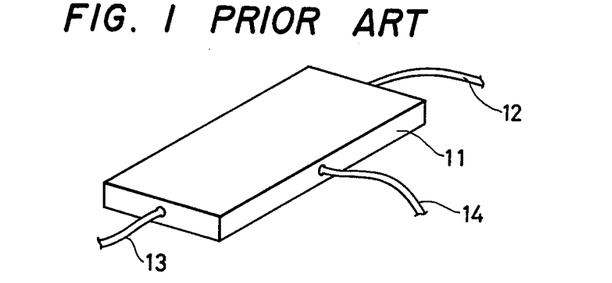
FIG. 1 is a perspective view schematically showing the external appearance of a conventional magnetoresistive element.
Figure 2:
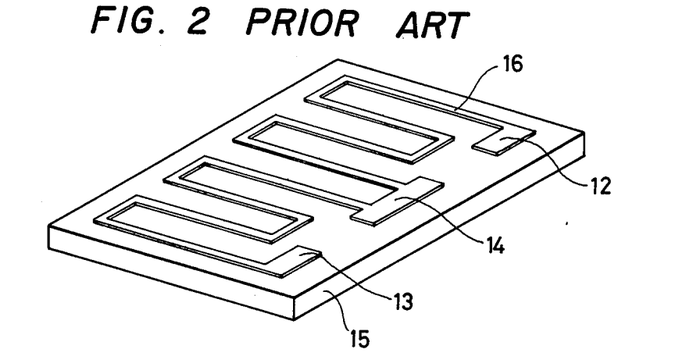
FIG. 2 is a perspective view schematically showing a magnetic film pattern of the conventional magnetoresistive element.

For a better understanding of the present invention, a description will be given first of a conventional temperature characteristic compensating type three-terminal magnetoresistive element. As shown in FIG. 1, terminals 12 and 13 are located at opposite ends of a semiconductor element 11 fabricated of a material such as InSb-NiSb and a terminal 14 is provided at the midpoint of one side of the semiconductor element 11. Alternatively, a magnetic thin film 16 fabricated of a material such as nickel cobalt is formed in zigzag pattern on an insulating substrate 15, and the terminals 12 and 13 are provided at both ends of the magnetic thin film 16 and the terminal 14 is provided at its midpoint as shown in FIG. 2.

The magnetoresistive element shown in FIG. 1 and 2 will be described with reference to its equivalent circuit of FIG. 3. The element is designated 19 and comprises resistance elements 17 and 18 which are connected between the terminals 12 and 14 and between the terminals 13 and 14, respectively. When a magnet 21, which is disposed with one of its magnetic poles adjacent the magnetoresistive element 19, is moved in its lengthwise direction, that is, in a direction parallel to a line joining the terminals 12 and 13, resistance values $R_{M1}$ and $R_{M2}$ of the resistance elements 17 and 18 undergo variations in response to the movement of the magnet 21. To the terminals 12 and 13 are applied voltages $+E_1$ and $-E_1$ from power source terminals 22 and 23, respectively. Resistors 24 and 25 are connected in series between the terminals 22 and 23, and the junction of the resistors 24 and 25 and the terminal 14 are respectively to two input sides of a differential amplifier 26.

In general, a resistance of a conductor as a function of temperature is expressed by $$\frac{Rt}{Ro} = \exp\left\{K\left(\frac{1}{Ta} - \frac{1}{To}\right)\right\} \tag{1}$$

where
 Rt is the resistance of the conductor at temperature Ta,
 Ro is the resistance of the conductor at a reference temperature To,
 K is a thermister constant of the conductor.

The thermister constant K is a resistance-temperature coefficient representing a resistance variation rate with respect to temperature, and also changes its value under the presence of a magnetic field. This is one of the causes which produce errors in the conventional differential type displacement sensor such as shown in FIG. 3.

Introducing a new variable T defined by Equation (2), Equation (1) can be expressed by Equation (3).

$$T = \frac{1}{Ta} - \frac{1}{To} \tag{2}$$

$$\frac{Rt}{Ro} = \exp(KT) \tag{3}$$

Denoting the thermister constant K in the absence and presence of a magnetic field by $K_1$ and $K_2$, respectively, Equation (3) becomes as follows:

$$\left(\frac{Rt}{Ro}\right)_m = \exp(K_2 T) \tag{4}$$

$$\left(\frac{Rt}{Ro}\right)_o = \exp(K_1 T) \tag{5}$$

where the suffixes "m" and "o" denote the presence and absence of a magnetic field, respectively.

The change is resistance of a magneto-sensitive material due to aging is usually exponential with respect to the lapse of years Y, so that the resistive value after Y years, Ry, can be expressed as follows using suitable functions $n_1(Y)$ and $n_2(Y)$ which are aging change coefficients in the absence and presence of a magnetic field, respectively.

$$\left(\frac{Ry}{Ro}\right)_m = \exp n_2(Y) \tag{6}$$

$$\left(\frac{Ry}{Ro}\right)_o = \exp n_1(Y) \tag{7}$$

Returning to FIG. 3, it is conventional to select the lengths L of the magnetoresistive parts 17, 18 and the length L of the magnet so that they are substantially identical to one another thereby to attain a maximum variable range of the output signal with a maximum size efficiency of a displacement sensor and a maximum effective stroke (i.e. displacement x) or the magnet. Let the electric characteristics of the magnetoresistive parts be defined as follows:

$R_{M1}$: Resistance between terminals 13 and 14,
 $R_{M10}$: Resistance of the portion of the magnetoresistive part 18 not covered by the magnet 21,
 $R_{M1m}$: Resistance of the portion of the magnetoresistive part 18 covered by the magnet 21,
 $R_{M2}$: Resistance between terminals 12 and 14,
 $R_{M20}$: Resistance of the portion of the magnetoresistive part 17 not covered by the magnet 21,
 $R_{M2m}$: Resistance of the portion of the magnetoresistive part 17 covered by the magnet 21,
 $\rho_0$: Resistance per unit length of the magnetoresistive parts 17, 18 in the absence of magnetic field,
 $\alpha\rho_0$: Resistance per unit length of the magnetoresistive parts 17, 18 in the presence of magnetic field, and
 $\eta_1$: Voltage dividing ratio given by $RM_2/(RM_1+RM_2)$ Then, applying Equations (4) through (7) the resistance $RM_1$ and $RM_2$ can be expressed as follows:

$$R_{M1} = R_{M10} + R_{M1m} \tag{8}$$

$$= \left(\frac{L}{2} + x\right)\rho_0\exp\{K_1T + n_1(Y)\} +$$

$$\left(\frac{L}{2} - x\right)\alpha\rho_0\exp\{K_2T + n_2(Y)\}$$

$$= \frac{L}{2}\rho_0[\exp\{K_1T + n_1(Y)\} + \alpha\exp\{K_2T + n_2(Y)\}] +$$

$$x\rho_0[\exp\{K_1T + n_1(Y)\} - \alpha\exp\{K_2T + n_2(Y)\}]$$

$$R_{M2} = R_{M20} + R_{M2m} \tag{9}$$

-continued $$= \left(\frac{L}{2} - x\right) \rho_0 \exp\{K_1 T + n_1(Y)\} +$$

$$\left(\frac{L}{2} + x\right) \alpha \rho_0 \exp\{K_2 T + n_2(Y)\}$$

$$= \frac{L}{2} \rho_0 [\exp\{K_1 T + n_1(Y)\} + \alpha \exp\{K_2 T + n_2(Y)\}] -$$

$$x \rho_0 [\exp\{K_1 T + n_1(Y)\} - \alpha \exp\{K_2 T + n_2(Y)\}]$$

The series connected resistance of the magnetoresistive parts 17, 18 is $$R_{M1} + R_{M2} = L\rho_0 [\exp\{K_1 T + n_1(Y)\} + \alpha \exp\{K_2 T + n_2(Y)\}]$$

Accordingly, the voltage dividing ratio $\eta_1$ is as follows:

$$\eta_1 = \frac{R_{M2}}{R_{M1} + R_{M2}} \quad (10)$$

$$= \frac{1}{2} - \frac{x}{L} \cdot \frac{\exp\{K_1 T + n_1(Y)\} - \alpha \exp\{K_2 T + n_2(Y)\}}{\exp\{K_1 T + n_1(Y)\} + \alpha \exp\{K_2 T + n_2(Y)\}}$$

$$= \frac{1}{2} - \frac{x}{L} \cdot \frac{1 - \alpha \exp\{(K_2 - K_1)T + n_2(Y) - n_1(Y)\}}{1 + \alpha \exp\{(K_2 - K_1)T + n_2(Y) - n_1(Y)\}}$$

Figure 3:
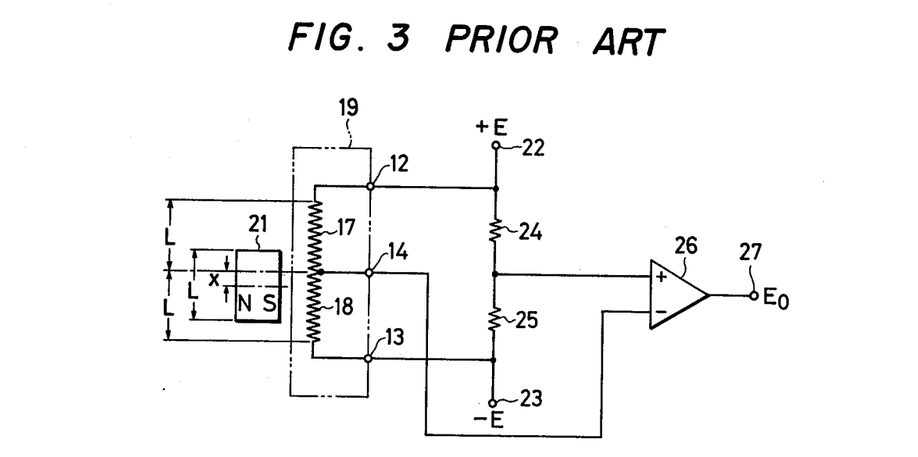
FIG. 3 is a diagram illustrating an output circuit using the conventional magnetoresistive element.

In the differential type displacement sensor shown in FIG. 3, the resistance $R_1$ of the resistor 24 is selected to be equal to the resistance $R_2$ of the resistor 25. Therefore, the potential $E_2$ of the junction of the resistors 24 and 25 is substantially zero volts, which is supplied as a reference voltage $E_2$ to the non-inverted input of the amplifier 26. The potential $E_3$ at the terminal 14 is $E_3 = E_1(2\eta_1 - 1)$. Denoting the gain of the amplifier 26 by $A_1$ and using Equation (10), the output Eo at the terminal 27 is as follows:

$$E_o = A_1(E_3 - E_2) = A_1 E_1(2\eta_1 - 1) \quad (11)$$

$$= -2A_1 E_1 \frac{x}{L} \cdot \frac{1 - \alpha \exp\{(k_2 - k_1)T + n_2(Y) - n_1(Y)\}}{1 + \alpha \exp\{(k_2 - k_1)T + n_2(Y) - n_1(Y)\}}$$

Assuming that no aging has occurred, and that the resistance-temperature coefficients $K_1$ and $K_2$ are equal, the output Eo becomes as follows:

$$E_o = -2A_1 E_1 \frac{X}{L} \cdot \frac{1 - \alpha}{1 + \alpha} \quad (12)$$

and it has nothing to do with temperature T. In general, however, $K_1 \neq K_2$ and $n_1(Y) \neq 0$, $n_2(Y) \neq 0$; therefore, the output Eo changes with temperature and with the lapse of time. The temperature variation of the output Eo of the Insb-NiSb magnetoresistive element of FIG. 1 is about 0.2%/°C., and the temperature variation of the output Eo of the magnetoresistive element of FIG. 2 using the nickel cobalt magnetic thin film is approximately 0.35%/°C.

Figure 4:
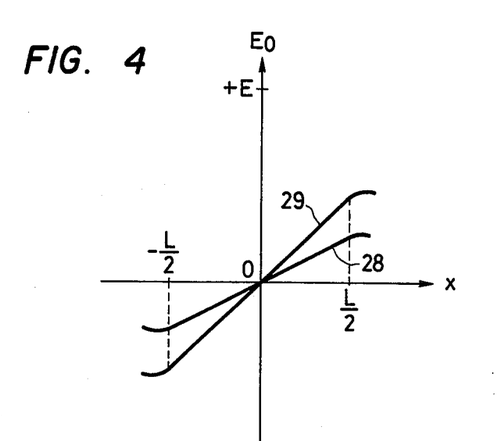
FIG. 4 is a graph showing variations in a potential Ex at a terminal 14 with respect to displacement x of a magnet in FIG. 3.
Figure 5:
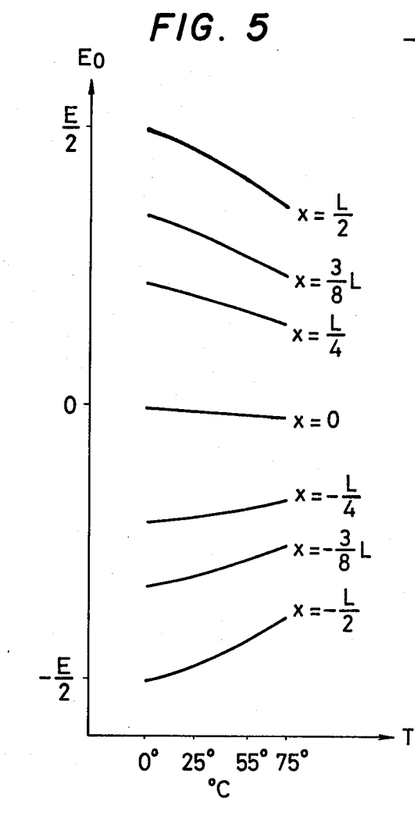
FIG. 5 is a graph showing the temperature variation characteristic of the potential Ex at the terminal 14 in FIG. 3.

In the case where a permanent magnet is used as the magnet 21, the magnetic field applied to the magnetoresistive element 19 is varied by temperature and aging changes of its magnetic flux density, resulting in $\alpha$ in expressions (1) and (2) changing. That is to say, a change in the potential Eo at the terminal 14 with respect to the displacement x of the magnet 21 is small as indicated by the line 28 in FIG. 4 when the temperature is high, and large as indicated by the line 29 when the temperature is low. Further, the potential Eo corresponding to each position of displacement x changes with respect to the temperature T. It is seen from FIGS. 4 and 5 that when the length of each of the magnetoresistive elements 17, 18 is L and the length of the magnet 21 is also L, the range in which the change in the potential Eo with the displacement x is linear and little affected by temperature variations is about $\pm\frac{1}{4}L$. Accordingly, it is impossible in the prior art to satisfy a requirement such, for example, as 10 μm resolution in the case of L=10 mm.

Figure 6:
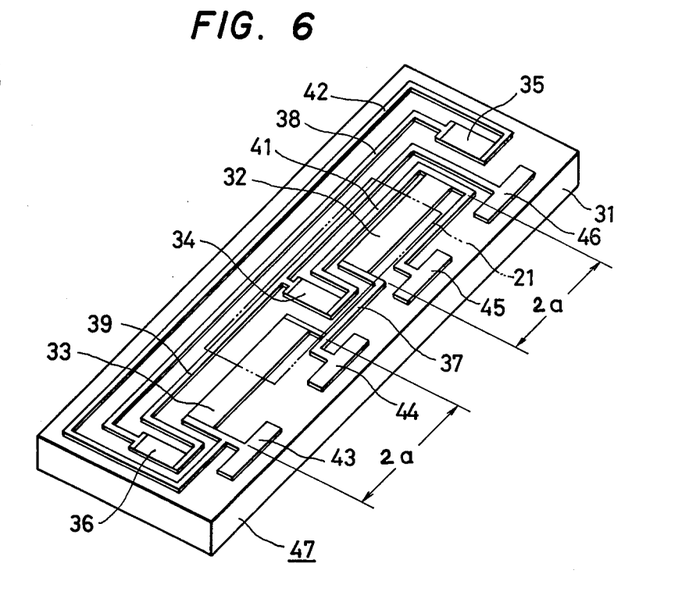
FIG. 6 is a perspective view illustrating a pattern of an example of the magnetoresistive element of the present invention.

FIG. 6 illustrates an embodiment of the magnetoresistive element of the present invention. Magnetoresistive parts 32 and 33 of the same size and shape are formed in alignment with one another on a rectangular-shaped insulating, e.g., ceramic, substrate 31 to extend in its lengthwise direction.

The length of each of the magnetoresistive parts 32 and 33 is represented by a, i.e. L=2a. The magnetoresistive parts 32 and 33 are substantially equal in their resistance values under no magnetic field conditions, and in their magnetic field-resistance variation and temperature-resistance characteristics. Furthermore, a magnetoresistive part 34 and magnetoresistive parts 35 and 36 are formed on the insulating substrate 31 between the magnetoresistive parts 32 and 33 and outside of their outer ends, respectively, so that under no magnetic field conditions the resistance value of the resistor 34 is substantially equal to the sum of the resistance values of the resistors 35 and 36. The inner ends of the magnetoresistive parts 32 and 33 are interconnected by a lead 37. The magnetoresistive parts 35 and 36 are connected in series by a lead 38 and one end of the series connection is connected via a lead 39 to one end of the magnetoresistive part 34, by which the magnetoresistive parts 34, 35 and 36 are connected in series to one another. The other end of the magnetoresistive part 34 and the outer end of the magnetoresistive part 32 are connected by a lead 41 and the other end of the magnetoresistive part 33 is connected by a lead 42 to the other end of the series connection of the magnetoresistive parts 35, 36. In short, the magnetoresistive parts 32 and 33 are connected in series and the magnetoresistive parts 34, 35 and 36 are connected in series, and the two series connections are interconnected in parallel to each other. Furthermore, terminals 43, 44, 45 and 46 are formed on the substrate 31, and the junctions of the magnetoresistive parts 33 and 35, 32 and 33, 32 and 34, and 34 and 36 are connected to the terminals 43, 44, 45 and 46, respectively. The magnetoresistive parts 32 to 36 have the same characteristic and are formed concurrently by a method such as vacuum vapor deposition, and the leads 37 to 39 and the terminals 43 to 46 are formed at the same time.

Figure 7:
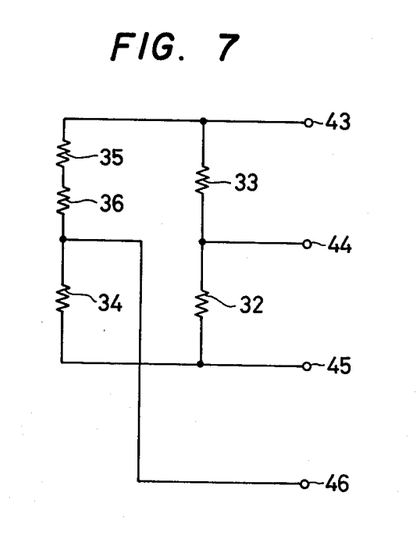
FIG. 7 is an equivalent circuit diagram of the magnetoresistive element shown in FIG. 6.
Figure 8:
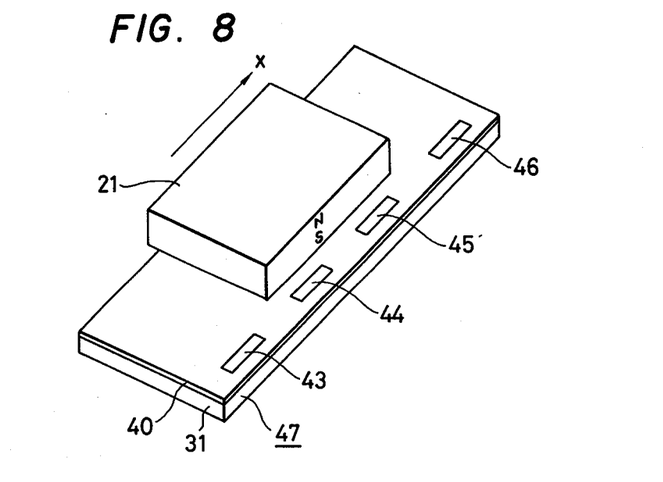
FIG. 8 is a perspective view showing the relationship between the magnet and the magnetoresistive element.

FIG. 7 shows an equivalent circuit of the magnetoresistive element 47 illustrated in FIG. 6. As shown in FIG. 8, a protective layer 40, e.g., glass, is formed on the magnetoresistive element 47 of FIG. 6 to cover the mangetoresistive parts and the leads except the terminals 43 to 46. In the case of using this magnetoresistive element 47, the magnet 21 is adapted to be movable in the direction of alignment of, and relative to, the magnetoresistive parts 32 and 33 of the magnetoresistive element 47. The arrangement is such that the magnetic field of the magnet 21 is always supplied to the magnetoresistive part 34 but is not applied to the magnetoresistive parts 35 and 36 at all times. That is to say, as illustrated in FIG. 6, the magnet 21 is so disposed that at the midpoint of its range of movement, it is opposite to the magnetoresistive parts 32, 33 and 34 with its opposite ends lying at the midpoints of the magnetoresistive parts 32 and 33 in their lengthwise direction, and the magnet 21 is designed to be movable in both directions lengthwise thereof by one-half of the length a of the magnetoresistive part 32 or 33.

Figure 9:
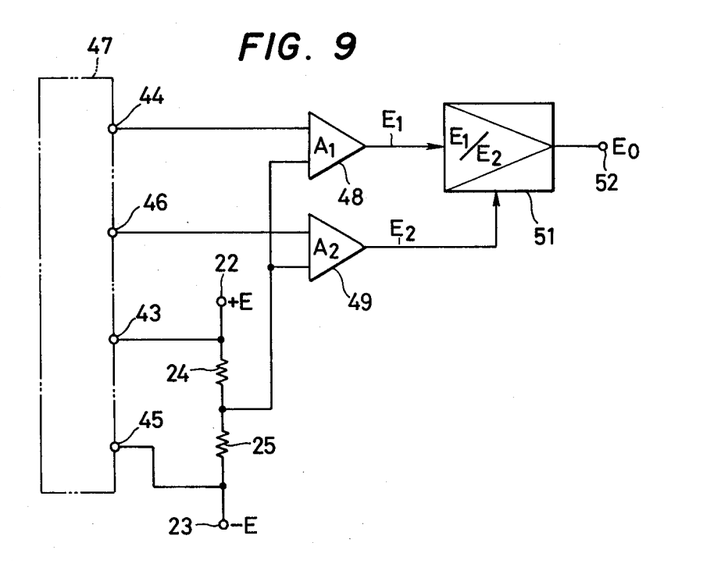
FIGS. 9 and 10 are circuit diagrams illustrating examples of output circuits employing the magnetoresistive element of the present invention.

For taking out a signal from the magnetoresistive element 47, a circuit connection such, for example, as shown in FIG. 9 is used. The terminals 44 and 46 are each connected to one of the input sides of two differential amplifiers 48 and 49, and the terminals 43 and 45 are connected to the power source terminals 22 and 23 which provide the voltages $+E$ and $-E$, respectively. The series connection of the resistors 24 and 25 is connected between the terminals 22 and 23, and the junction of the resistors 24 and 25 is connected to the other input sides of the differential amplifiers 48 and 49. The resistance values of the resistors 24 and 25 are equal to each other as is the case of FIG. 3. The output of the differential amplifier 48 is divided by the output of the differential amplifier 49 in a divider 51, the output of which is derived at an output terminal 52.

It will be understood that Equation (11) which is obtained with respect to the differential output detection arrangement shown in FIG. 3 can apply to both the differential output provided by the set of the resistors 24, 25, 32 and 33 and the differential output provided by the set of the resistors 24, 25, 34, 35 and 36, where the latter corresponds to the case of $x = L/2$ because the resistor 34 is always covered by the magnet while the resistors 35 and 36 are not. The length L of the magnetoresistive part 32 (or 33) may not necessarily be equal to that of the magnetoresistive part 34. Letting the gains of the differential amplifiers 48 and 49 be represented by $A_1$ and $A_2$, the output voltages $E_{o1}$ and $E_{o2}$ of the amplifiers 48 and 49 are given by the following expressions:

$$E_{o1} = -2A_1 E \frac{x}{L} \cdot \frac{1 - \alpha\exp\{(k_2 - k_1)T + n_2(Y) - n_1(Y)\}}{1 + \alpha\exp\{(k_2 - k_1)T + n_2(Y) - n_1(Y)\}} \quad (13)$$

$$E_{o2} = -A_2 E \cdot \frac{1 - \alpha\exp\{(k_2 - k_1)T + n_2(Y) - n_1(Y)\}}{1 + \alpha\exp\{(k_2 - k_1)T + n_2(Y) - n_1(Y)\}} \quad (14)$$

Accordingly the output Eo of the divider 51 is expressed as follows:

$$E_o = \frac{E_{o1}}{E_{o2}} = \frac{A_1}{A_2} \cdot \frac{2x}{L} \quad (15)$$

It is apparent from Equation (15) that the output Eo of the divider 51 is a function of only the variable x, providing $A_1$, $A_2$ and L do not vary. That is to say, temperature variations and aging variations of the magnetoresistive element are completely compensated by the present invention.

Let the resistance values of the magnetoresistive parts 32, 33 and 34 are represented by $R_{M1}$, $R_{M2}$ and $R_{M3}$, the resistance values of the resistors 24 and 25 by $R_1$ and $R_2$, and the sum of the resistance values of the magnetoresistive parts 35 and 36 by $R_{M4}$, all in the absence of the magnetic field. In the foregoing, it is assumed that $R_{M1} = R_{M2}$, $R_{M3} = R_{M4}$ and $R_1 = R_2$; however, experimental measurements have shown that when constants $C_1$ and $C_2$ given hereinafter in Equation (16) satisfied Expression (17), sufficient compensation in practical use of the magnetoresistive element was attained.

$$\frac{R_{M2}}{R_{M1}} = C_1 \frac{R_{M4}}{R_{M3}} = C_2 \frac{R_2}{R_1} \quad (16)$$

$$0.7 \leq C_1 \leq 1.4 \quad (17)$$
$$0.7 \leq C_2 \leq 1.4$$

For the magnetoresistive parts of the magnetoresistive element, use can be made of semiconductors, such as InSb and InSb-NiSb formed as a single crystal wafer or a vapor deposited thin film, and metal magnetic materials, such as NiCo formed as a vapor-deposited thin film and so forth. For satisfying the abovesaid requirement of expression (17), it is necessary to adjust the width and/or length of the magnetoresistive parts, e.g., by etching or laser trimming.

Figure 10:
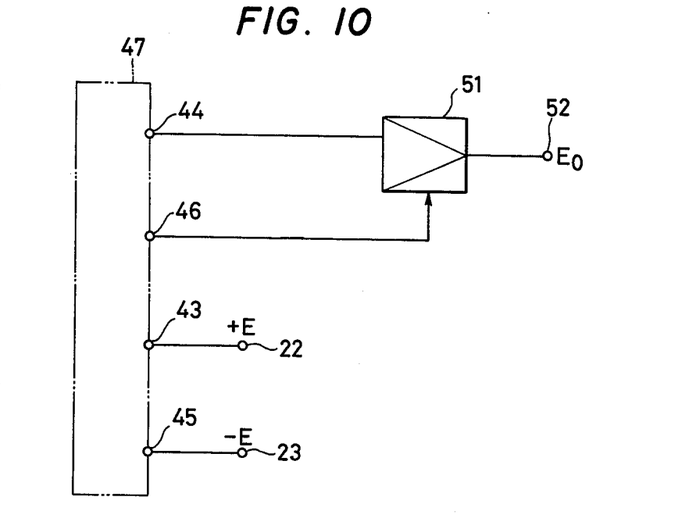

It is preferred that the arrangement of the magnetoresistive parts 32 to 36 be symmetric with respect to the center of displacement of the magnet 21 as shown in FIG. 6 so as to balance heat generation caused by the current flow through the magnetoresistive parts. In the case of FIG. 9, since the potential at the connection point of the magnetoresistive parts 34 and 36, that is, at the terminal 46 is substantially zero volt regardless of the relative displacement of the magnet 21 relative to the magnetoresistive element 47, the outputs of the terminals 44 and 46 can be supplied directly to the divider 51 and the resistors 24 and 25 can be omitted as shown in FIG. 10. However, in FIG. 9, the absolute value of the voltage $-E$ at the terminal 23 may not be equal to the voltage at the terminal 22. For example, instead of supplying a constant voltage, either one of the terminals 22 and 23 can be grounded, without altering the applicability of Equation (15). In such a case, the embodiment of FIG. 10 cannot be used.

Figure 11:
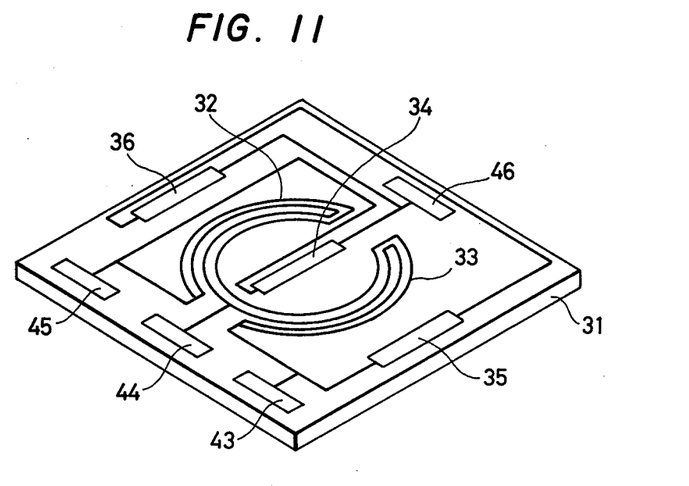
FIG. 11 is a perspective view showing an example of the magnetic film pattern of the magnetoresistive element of the present invention for use with a magnet of the rotating type.
Figure 12:
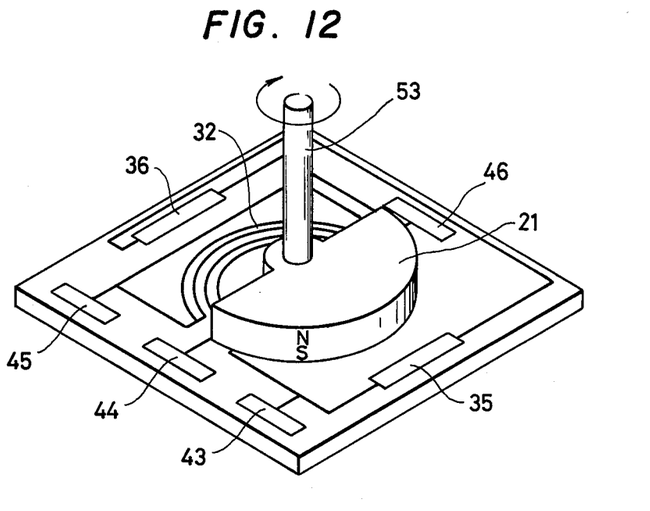
FIG. 12 is a diagram showing the relationship between the magnetoresistive element of FIG. 11 and the magnet.

It is possible to so arrange the magnetoresistive element that the magnet 21 can be rotated relative thereto in a manner to detect the rotational angle of the magnet. This is exemplified in FIG. 11. In this case, the magnetoresistive part 32 is provided in a semicircular form and, in order to increase its length, the semicircle is doubled. The magnetoresistive part 33 is similarly formed by two semicircles which form a substantially circular pattern together with the magnetoresistive part 32. The magnetoresistive part 34 is disposed on one of the diameters of the circle and the magnetoresistive parts 35 and 36 are disposed symmetrically outside the circle at diametrically opposite positions. The interconnections of these magnetoresistive parts 32 to 36 and the connections of the terminals 43 to 46 are identical with those used in FIG. 6. As shown in FIG. 12, the cooperating magnet 21 is formed as a unitary structure in a shape having a larger semicircular plate portion and a smaller semicircular plate portion with their diametric sides joined to each other so that the magnetoresistive part 34 is always covered by the magnet 21. The magnet 21 is rotated by a shaft 53 on the magnetoresistive parts 32 and 33 about the center of the circular pattern formed by them. Also in this case, the arrangement is such that the magnetic field of the magnet 21 is not applied to the magnetoresistive parts 35 and 36 at all times.

Figure 13:
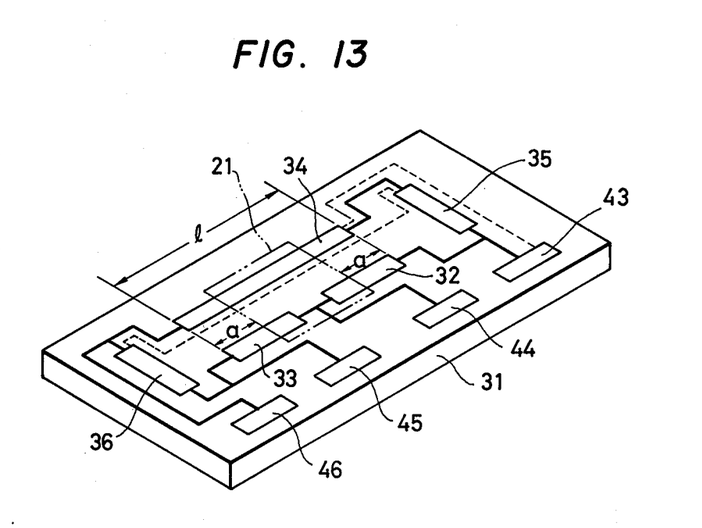
FIG. 13 is a perspective view showing the magnetic film pattern of another example of the magnetoresistive element of the present invention for use with a magnet of the linearly moving type.

In the arrangement of FIG. 6, where the distribution of the substrate temperature based on heat generation by the current flow through the magnetoresistive parts is not badly nonuniform, the magnetoresistive parts 35 and 36 can be combined into one magnetoresistive part. The magnetoresistive parts 32 and 33 are usually of the same characteristics. While the foregoing embodiments are arranged so that the magnetic field of the magnet 21 is always applied to the magnetoresistive part 34 over the entire area thereof, it is also possible to apply the magnetic field of the magnet 21 to only a portion of the magnetoresistive part 34 at all times. In this case, the areal ratio between the portions of the magnetoresistive part 34 which are exposed and unexposed to the magnetic field is fixed regardless of the displacement of the magnet 21. For instance, as shown in FIG. 13 in which the parts corresponding to those in FIG. 6 are identified by the same reference numerals, the magnetoresistive part 34 is disposed in parallel to the alignment of the magnetoresistive parts 32 and 33 and, in this case, the magnetoresistive part 34 is formed to extend at least over the entire range of movement 1 of the magnet 21. The magnet 21 is moved in opposing relation to the magnetoresistive parts 32, 33 and 34. The length of that portion of the magnetoresistive part 34 which is covered by the magnet 21 is constant regardless of the movement of the magnet 21. In this embodiment the magnetoresistive parts 35, 34 and 36 are connected in series and the sum $R_{M3}'$ of the resistance values of the magnetoresistive parts 34 and 35 in the absence of the magnetic field and the resistance value $R_{M4}'$ of the magnetoresistive part 36 in the absence of the magnetic field are selected to bear the following relationship:

$$\frac{R_{M2}}{R_{M1}} = \frac{R'_{M4}}{R'_{M3}}$$

As indicated by the broken lines in FIG. 13, the magnetoresistive parts 34, 35 and 36 may also be connected in the same manner as in the case of FIG. 6. In such a case, it is necessary to satisfy expression (17).

Figure 14:
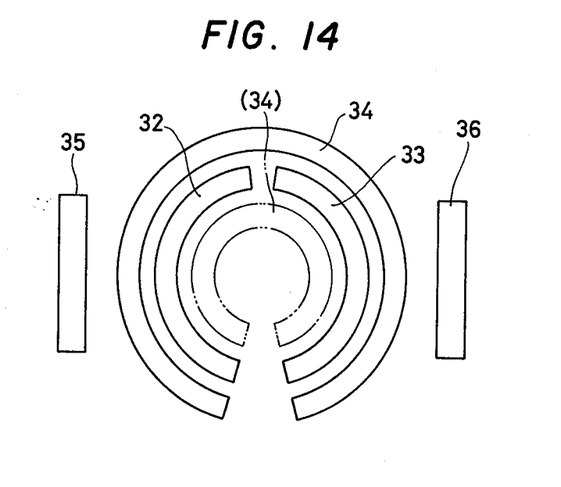
FIG. 14 is a diagram showing a modification of the magnetic film pattern of FIG. 13 for use with the magnet of the rotating type.
Figure 15:
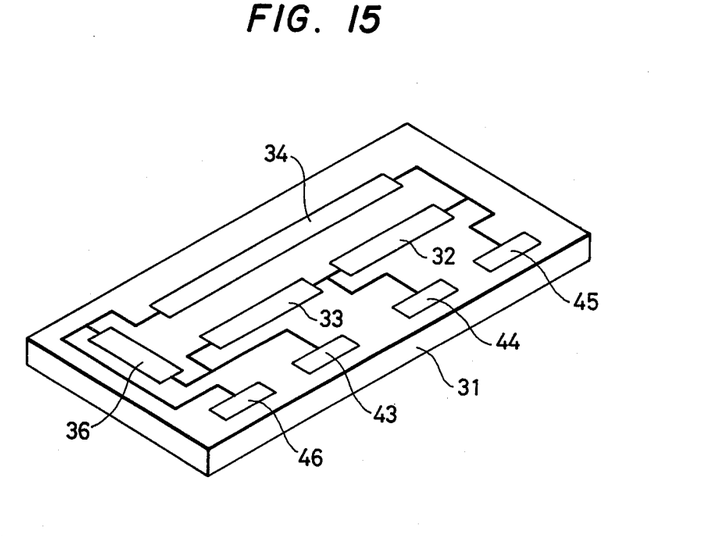
FIG. 15 is a perspective view illustrating the magnetic film pattern of an example in which magnetoresistive parts that are always free of a magnetic field are located on one side of a substrate.

The rotating magnet type of magnetoresistive element can also be arranged so that the magnetic field of the magnet is applied to only a portion of the magnetoresistive part 34. This can be achieved, for instance, by forming the parallel magnetoresistive parts 32, 33 and 34 in FIG. 13 in a circular form such as is shown in FIG. 14. In this case, the magnetoresistive part 34 may also be disposed inside as indicated by the broken line. Though not shown, the magnetoresistive parts 32 to 36 are connected as in the case of FIG. 6 or 13 and the terminals 43 to 46 are also provided. As described previously, in the case where the temperature distribution of the substrate 31 does not become too non-uniform, the magnetoresistive parts 35 and 36 can also be combined; this is exemplified in FIG. 15 as applied to the example of FIG. 13. In FIG. 15 the parts corresponding to those in FIG. 13 are identified by the same reference numerals.

Figure 16:
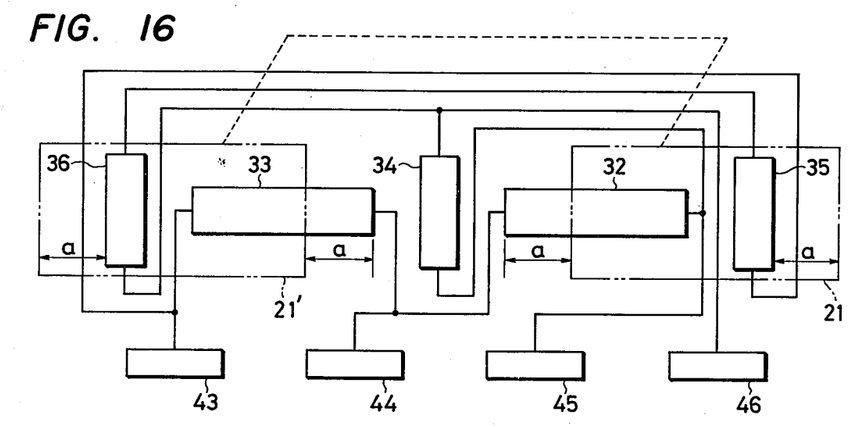
FIG. 16 is a diagram illustrating the magnetic film pattern of an example in which magnetoresistive parts which are always exposed to a magnetic field are disposed on both sides of the substrate.

It is also possible to employ an arrangement in which a magnetic field is always applied to the magnetoresistive parts 35 and 36 outside the magnetoresistive parts 32 and 33 in the direction of their alignment but is not applied to the magnetoresistive part 34 between them at all times. For example, as shown in FIG. 16, the magnet 21 is disposed opposite the magnetoresistive parts 32 and 35, and another magnet 21' is disposed opposite the magnetoresistive parts 33 and 36. The magnets 21 and 21' are fixed relative to each other and moved at the same time. The lengths of the magnets 21 and 21' in the direction of their movement are selected so that the magnetoresistive parts 35 and 36 respectively confront the magnets 21 and 21' even at their outermost positions. As the magnets 21 and 21', separate magnets are used or north and south magnetic poles of one magnet are used.

Figure 17:
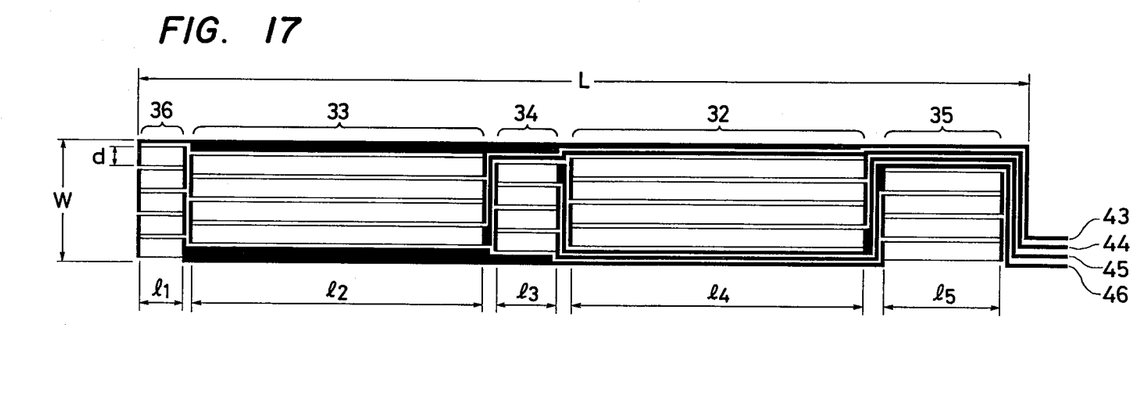
FIG. 17 is a diagram illustrating a magnetic film pattern of a practical example of the present invention, where each of the magnetoresistive parts consists of a plurality of elongated magnetosensitive sections which are arranged in parallel and connected in series.

FIG. 17 shows an example of a practical pattern of the magnetoresistive parts 32-36; connecting wires through the terminals 43-46 are not shown. The entire size L×W of the pattern is about 36×1 mm. Each of the magnetoresistive parts 32-36 consists of a plurality of elongated magnetoresistive sections having an identical length and an identical width, arranged in parallel to one another and connected in series to one another by vacuum deposited metal wires so as to obtain a desired total resistance value as the magnetoresistive part. The lengths $l_1$, $l_2$, $l_3$, $l_4$ and $l_5$ of the magnetoresistive sections of the magnetoresistive parts 36, 33, 34, 32 and 35 are 1.99, 12.49, 2.59, 12.49 and 5.09 mm, respectively, while, the width d of each section is 0.15 mm. With an arrangement such as shown in FIG. 17, it was experimentally found that the output voltage variation ratio per 1° C. of the compensated magnetoresistive element according to the present invention was about 0.0025%/°C. within the range from −20° C. to 100° C., while, in the case noncompensated output voltage which was obtained without using the output from the terminal 46, the output voltage variation ratio per 1° C. was about 0.21%/°C. within the same temperature range.

It will be apparent that many modifications and variations may be effected without departing from the scope of the novel concepts of the present invention.

What is claimed is:

1. A magnetoresistive differential potentiometer comprising:
   a substrate fabricated of an insulating material;
   first and second magnetoresistive parts formed in spaced relation to one another on said substrate in alignment with one another along a line, said first and second parts being electrically connected in series with one another, being of the same length, and having resistance values which are similar to each other in the absence of a magnetic field;
   a third magnetoresistive part formed on said substrate adjacent said spaced first and second magnetoresistive parts;
   a movable magnet having a length, along said line, equal to the distance between the center points of said first and second magnetoresistive parts, said magnet being disposed above said substrate and being so movable along said line that at least a fixed length portion of said third magnetoresistive part is always under said magnet and the sum of first and second length portions of said first and second magnetoresistive parts which are disposed under said magnet is always constant;
   a fourth magnetoresistive part formed on said substrate outside of the area which said movable magnet may cover during its movement, said fourth part being electrically connected in series to said third magnetoresistive part and having a resistance value similar to that of said third magnetoresistive part in the absence of a magnetic field;
   means connecting said series connected first and second magnetoresistive parts in parallel with said series connected third and fourth magnetoresistive parts to form a bridge circuit;

first and second terminals electrically connected to opposing ends of said parallel connection, respectively, for supplying a voltage across said bridge circuit; and third and fourth terminals electrically connected to the series connection point between said first and second magnetoresistive parts and to the series connection point between said third and fourth magnetoresistive parts, respectively, for deriving outputs therefrom.

2. The differential potentiometer of claim 1 wherein said third part is formed in alignment with, and between, said first and second parts.

3. The differential potentiometer of claim 1 wherein said third part extends alongside said series connected first and second parts.

4. A magnetoresistive differential potentiometer comprising:

a substrate fabricated of an insulating material;

first and second magnetoresistive parts respectively formed on opposing half portions of a common circle on said substrate, said first and second parts being electrically connected in series to each other, having resistance values similar to each other in the absence of a magnetic field, and being of the same length;

a third magnetoresistive part formed on said substrate inside the circular arrangement of said first and second magnetoresistive parts;

a movable magnet having a circular first portion and a semicircular second portion formed around said first portion integrally and concentrically therewith, said circular first portion of said magnet having a diameter smaller than the inner diameter of the circular arrangement of said first and second magnetoresistive parts, said semicircular second portion having a diameter larger than the outer diameter of the circular arrangement of said first and second magnetoresistive parts and a length along said circle equal to a length between center points of said first and second magnetoresistive parts, and said magnet being disposed above said substrate and being movable relative to said circle such that said third magnetoresistive part is always covered by said circular first portion of the magnet and the sum of first and second angular portions of said first and second magnetoresistive parts under said magnet is always constant;

a fourth magnetoresistive part formed on said substrate outside the circular arrangement of said first and second magnetoresistive parts and electrically connected in series to said third magnetoresistive part, said fourth part having a resistance value similar to that of said third part in the absence of a magnetic field;

means connecting said series connected first and second parts in parallel with said series connected third and fourth parts to form a bridge circuit;

first and second terminals electrically connected to opposing ends of said parallel connection, respectively, for supplying a voltage across said bridge circuit; and third and fourth terminals electrically connected to the series connection between said first and second magnetoresistive parts and to the series connection between said third and fourth magnetoresistive parts, respectively, for deriving outputs therefrom.

5. A magnetoresistive differential potentiometer according to claim 4, wherein said line is a straight line and said magnet has a rectangular pole face and is linearly movable.

6. A magnetoresistive differential potentiometer according to claim 1 or 4, wherein said line is a circular line and said magnet is rotatively movable.

7. A magnetoresistive differential potentiometer according to claim 1, 4, or 2, wherein said fourth magnetoresistive part comprises two portions electrically connected in series to each other and disposed apart from each other.

8. A magnetoresistive differential potentiometer according to claim 1, 4, or 2, comprising a divider electrically connected to said third and fourth terminals, for dividing one of the outputs from said third and fourth terminals by the other output to produce a compensated differential output.

9. A magnetoresistive differential potentiometer according to claim 1, 4, or 2, comprising:

first and second resistors having resistance values similar to each other and electrically connected in series to each other, the opposing ends of said series connected first and second resistors being electrically connected to said first and second terminals;

first and second differential amplifiers each of which has two inputs, one input of said first and second differential amplifiers being electrically connected to said third and fourth terminals, respectively, and the other inputs of said amplifiers being electrically connected to the junction of said first and second resistors; and a divider electrically connected to the outputs of said first and second differential amplifiers, for dividing one of the amplifier outputs by the other amplifier output to produce a compensated differential output.

10. A magnetoresistive differential potentiometer comprising:

a substrate fabricated of an insulating material first and second spaced magnetoresistive parts formed on said substrate in alignment with one another along a straight line, said first and second parts being electrically connected in series to each other, having resistance values similar to each other in the absence of a magnetic field, and being of the same length;

a third magnetoresistive part formed on said substrate between the adjacent ends of said spaced first and second magnetoresistive parts;

a fourth magnetoresistive part formed on said substrate and electrically connected in series to said thrid magnetoresistive part, said fourth part having a resistance value similar to that of said third part in the absence of a magnetic field and comprising two series-connected portions which are separately disposed along said straight line adjacent the outer ends respectively of said aligned first and second magnetoresistive parts;

means connecting said series connected first and second parts in parallel with said series connected third and fourth parts to form a bridge circuit;

first and second terminals electrically connected to the opposing ends of said parallel connection, respectively, for supplying a voltage across said bridge circuit;

third and fourth terminals electrically connected to the series connection point between said first and second magnetoresistive parts and to the series connection point between said third and fourth magnetoresistive parts, respectively, for deriving outputs therefrom; and movable first and second magnetic field applying means fixed in position relative to one another and spaced from one another along said line by a distance equal to the distance between the center points of said first and second magnetoresistive parts, the length of each of said first and second magnetic field applying means being sufficient respectively to cover one of said first and second magnetoresistive parts and on adjacent one of said two portions of said fourth magnetoresistive part, said first and second magnetic field applying means being disposed above said substrate for movement along said straight line such that said two portions of said fourth magnetoresistive part are always under said first and second magnetic field applying means, respectively, and the sum of first and second length portions of said first and second magnetoresistive parts which are disposed under said first and second magnetic field applying means, respectively, is always constant.

* * * * *